United States Patent
Lai et al.

(10) Patent No.: US 9,515,039 B2
(45) Date of Patent: Dec. 6, 2016

(54) SUBSTRATE STRUCTURE WITH FIRST AND SECOND CONDUCTIVE BUMPS HAVING DIFFERENT WIDTHS

(71) Applicant: Siliconware Precision Industries Co., Ltd., Taichung (TW)

(72) Inventors: Chieh-Lung Lai, Taichung (TW); Lu-Yi Chen, Taichung (TW); Yu-Chuan Chen, Taichung (TW); Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/983,738

(22) Filed: Dec. 30, 2015

(65) Prior Publication Data

US 2016/0322323 A1 Nov. 3, 2016

(30) Foreign Application Priority Data

May 1, 2015 (TW) .............................. 104114027 A
Sep. 9, 2015 (TW) .............................. 104129755 A

(51) Int. Cl.
  *H05K 1/00* (2006.01)
  *H01L 23/00* (2006.01)
(52) U.S. Cl.
  CPC ....... *H01L 24/14* (2013.01); *H01L 2224/1403* (2013.01); *H01L 2224/14104* (2013.01); *H01L 2224/14505* (2013.01)

(58) Field of Classification Search
  CPC ........ H05K 1/00; H05K 3/244; H05K 3/3473; H05K 2201/094
  USPC .......... 439/67; 247/786, 784, 737, 734, 738, 247/778; 257/786, 784, 737, 734, 738, 778
  See application file for complete search history.

(56) References Cited

U.S. PATENT DOCUMENTS

2008/0020602 A1\* 1/2008 Shih ....................... H05K 3/244
  439/67
2014/0356986 A1\* 12/2014 Clore ...................... H01L 24/81
  438/15

\* cited by examiner

*Primary Examiner* — Alexander Oscar Williams
(74) *Attorney, Agent, or Firm* — Mintz Levin Cohn Ferris Glovsky and Popeo, P.C.; Peter F. Corless; Steven M. Jensen

(57) ABSTRACT

A substrate structure is provided, which includes a substrate body having a plurality of conductive pads, and a plurality of first conductive bumps and a plurality of second conductive bumps disposed on the conductive pads. Each of the second conductive bumps is less in width than each of the first conductive bumps, and is of a height with respect to the substrate body greater than a height of each of the first conductive bumps with respect to the substrate body. Therefore, the height difference between the first pre-solder layer and the second pre-solder layer after a reflow process can be compensated, and the first conductive bumps and the second conductive bumps thus have a uniform height.

10 Claims, 3 Drawing Sheets

SUBSTRATE STRUCTURE WITH FIRST AND SECOND CONDUCTIVE BUMPS HAVING DIFFERENT WIDTHS

CROSS-REFERENCES TO RELATED APPLICATIONS

This application claims under 35 U.S.C. §119(a) the benefit of Taiwanese Application No. 104114027, filed May 1, 2015, and Taiwanese Application 104129755, filed Sep. 9, 2015 the entire contents of which are incorporated herein by reference.

BACKGROUND OF THE INVENTION

1. Field of the Invention

The present invention relates to a substrate structure, and, more particularly, to a substrate structure having conductive bumps.

2. Description of Related Art

As electronic elements such as chips and packaging substrates have reduced trace widths and pitches, conductive pads of the electronic elements have narrower pitches therebetween. Generally, conductive bumps are disposed on the conductive pads and reflowed to form solder balls. However, the narrower pitches between the conductive pads likely cause solder bridging to occur between adjacent solder balls, thereby resulting in a short circuit.

To overcome the above-described drawback, metal posts having a high melting point (such as copper or nickel posts) are disposed on the conductive pads, followed by formation of a small amount of a solder material on the metal posts to serve as a bonding layer. Since the metal posts will not be melted into a ball shape during a reflow process, they are applicable to fine-pitch conductive pads.

Generally, the diameter of the conductive pads, the diameter of the metal posts and the amount of the solder material on the metal posts are uniform. Therefore, after the reflow process, the solder balls can have a uniform height. That is, the solder balls are coplanar, which facilitates to increase the bonding reliability between electronic elements.

However, along with the progress of technologies, some conductive pads of an electronic element are required to have a small diameter to meet the demand for more I/O counts, and some conductive pads of the electronic element are required to have a large diameter to facilitate electrical probe tests. Therefore, the conductive pads of different diameters are provided on the same electronic element. Moreover, in order to meet the coplanarity requirement, the height difference between conductive bumps that are disposed on the conductive pads of different diameters is required to be less than 8 µm.

As shown in FIG. 1A, a conventional packaging substrate 1 has a substrate body 10 having a plurality of conductive pads 100a, 100b, a plurality of first conductive bumps 11 disposed on the conductive pads 100a, and a plurality of second conductive bumps 12 disposed on the conductive pads 100b. Each of the first conductive bumps 11 has a first copper-nickel layer 110 and a first pre-solder layer 111 of tin-silver formed on the first copper-nickel layer 110. Each of the second conductive bumps 12 has a second copper-nickel layer 120 and a second pre-solder layer 121 of tin-silver formed on the second copper-nickel layer 120. The conductive pads 100a, 100b have different diameters. The width W of each of the second conductive bumps 12 is less than the width R of each of the first conductive bumps 11, but the height L of each of the second conductive bumps 12 with respect to the substrate body 10 is equal to the height L of each of the first conductive bumps 11 with respect to the substrate body 10.

To bond the packaging substrate 1 with a chip (not shown), the first and second pre-solder layers 111, 121 are reflowed into solder balls 111', 121', respectively, for the chip to be bonded thereto. During the reflow process, the first and second copper-nickel layers 110, 120 will not be melted into balls.

However, since the width R of each of the first conductive bumps 11 is different from the width W of each of the second conductive bumps 12, the height L' of each of the first conductive bumps 11 with respect to the substrate body 10 is inconsistent with the height L" of each of the second conductive bumps 12 with respect to the substrate body 10 after the reflow process is performed on the first and second pre-solder layers 111, 121 that have the same thickness, and the height difference is greater than 8 µm. Therefore, the coplanarity requirement is not met, as shown in FIG. 1B, and the height L" of each of the second conductive bumps 12 with respect to the substrate body 10 is less than the height L' of each of the first conductive bumps 11 with respect to the substrate body 10.

Therefore, it has become critical as to how to overcome the above-described drawbacks.

SUMMARY OF THE INVENTION

In view of the above-described drawbacks, the present invention provides a substrate structure, which comprises: a substrate body having a plurality of conductive pads; a plurality of first conductive bumps disposed on a portion of the plurality of the conductive pads and each containing at least a first conductive material; and a plurality of second conductive bumps disposed on a remaining portion of the plurality of the conductive pads and each containing at least a second conductive material, wherein each of the second conductive bumps is less in width than each of the first conductive bumps, and is of a height with respect to the substrate body greater than a height of each of the first conductive bumps with respect to the substrate body.

In an embodiment, the substrate structure is a wafer, a chip, an interposer or a packaging substrate.

In an embodiment, the first conductive material of the first conductive bumps is a first pre-solder layer that is formed by copper, nickel, gold, tin, silver or a combination thereof, and the second conductive material of the second conductive bumps is a second pre-solder layer that is formed by copper, nickel, gold, tin, silver or a combination thereof. Further, each of the first conductive bumps can further comprise a first metal layer with the first pre-solder layer formed thereon, and each of the second conductive bumps can further comprise a second metal layer with the second pre-solder layer formed thereon. The second metal layer can be greater in thickness than the first metal layer. The first metal layer can be greater in melting point than the first pre-solder layer, and the second metal layer can be greater in melting point than the second pre-solder layer. The thickness of the first metal layer can be 10% to 90% of the thickness of the first conductive bump, and the thickness of the second metal layer can be 10% to 90% of the thickness of the second conductive bump.

In an embodiment, the height of the first conductive bump with respect to the substrate body can be 10% to 90% of the height of the second conductive bump with respect to the substrate body.

According to the present invention, the height of the first conductive bump with respect to the substrate body is less than the height of the second conductive bump with respect to the substrate body. Therefore, the height difference between the first pre-solder layer and the second pre-solder layer after a reflow process can be compensated, and the first conductive bump and the second conductive bump can have a uniform height, thereby meeting the coplanarity requirement.

BRIEF DESCRIPTION OF DRAWINGS

FIG. 2B' is a schematic cross-sectional view of a substrate structure of a second embodiment according to the present invention;

DETAILED DESCRIPTION OF PREFERRED EMBODIMENTS

The following illustrative embodiments are provided to illustrate the disclosure of the present invention. These and other advantages and effects can be apparent to those in the art after reading this specification.

It should be noted that all the drawings are not intended to limit the present invention. Various modifications and variations can be made without departing from the spirit of the present invention. Further, the terms such as "first," "second," "on," "a" etc. are merely for illustrative purposes and should not be construed to limit the scope of the present invention.

Figure 1A:
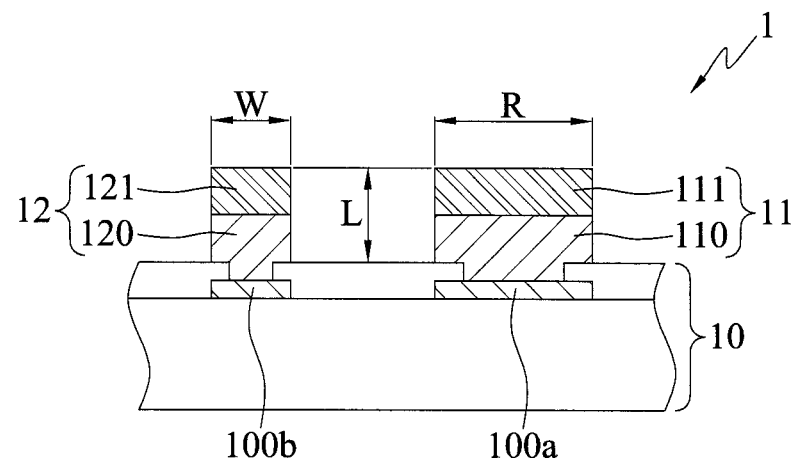
FIG. 1A is a schematic cross-sectional view of a conventional packaging substrate.
Figure 1B:
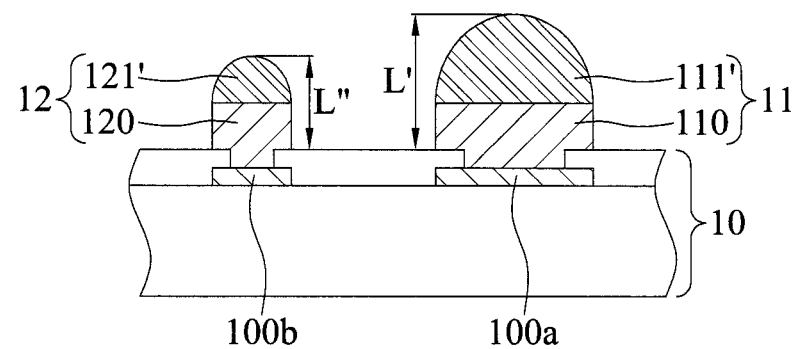
FIG. 1B is a schematic cross-sectional view of the conventional packaging substrate after a reflow process.
Figure 2A:
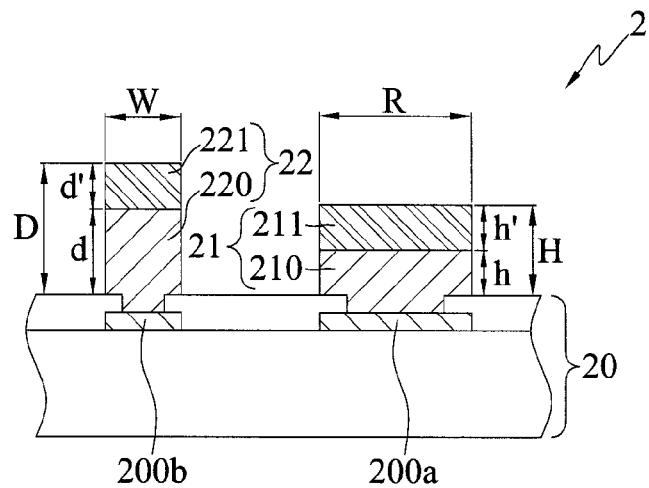
FIG. 2A is a schematic cross-sectional view of a substrate structure of a first embodiment according to the present invention.

FIG. 2A is a schematic cross-sectional view of a substrate structure 2 of a first embodiment according to the present invention. Referring to FIG. 2A, the substrate structure 2 has a substrate body 20 having a plurality of conductive pads 200a, 200b, a plurality of first conductive bumps 21 disposed on the conductive pads 200a, and a plurality of second conductive bumps 22 disposed on the conductive pads 200b.

The substrate structure 2 is, for example, a wafer, a chip, a silicon interposer or a packaging substrate.

The diameter of each of the conductive pads 200a is different from the diameter of each of the conductive pads 200b.

Each of the first conductive bumps 21 has at least two conductive materials, including a first metal layer 210 and a first pre-solder layer 211 formed on the first metal layer 210.

Each of the second conductive bumps 22 has at least two conductive materials, including a second metal layer 220 and a second pre-solder layer 221 formed on the second metal layer 220.

In an embodiment, the melting point of the first metal layer 210 is greater than that of the first pre-solder layer 211, and the melting point of the second metal layer 220 is greater than that of the second pre-solder layer 221. For example, the first metal layer 210 and the second metal layer 220 comprise copper or nickel, and the first pre-solder layer 211 and the second pre-solder layer 221 comprise tin-silver.

The width W of the second conductive bump 22 is less than the width R of the first conductive bump 21.

Further, the thickness d of the second metal layer 220 is greater than the thickness h of the first metal layer 210, and the thickness h' of the first pre-solder layer 211 is equal to the thickness d' of the second pre-solder layer 221. Therefore, the height D of the second conductive bump 22 with respect to the substrate body 20 is greater than the height H of the first conductive bump 21 with respect to the substrate body 20. For example, the height H of the first conductive bump 21 with respect to the substrate body 20 is 10% to 90% of the height D of the second conductive bump 22 with respect to the substrate body 20.

Furthermore, the thickness h of the first metal layer 210 is 10% to 90% of the thickness (i.e., the height H) of the first conductive bump 21, and the thickness d of the second metal layer 220 is 10% to 90% of the thickness (i.e., the height D) of the second conductive bump 22.

When the substrate structure 2 is bonded to an electronic device (not shown), the first pre-solder layer 211 and the second per-solder layer 221 are reflowed, and the first and second conductive bumps 21, 22 are bonded to the electronic device. The electronic device can be a circuit board, an active element such as a semiconductor chip, a passive element such as a resistor, a capacitor or an inductor, or a combination thereof.

Figure 2B:
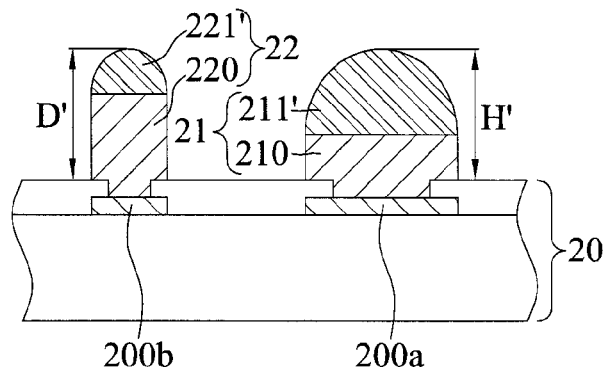
FIG. 2B is a schematic cross-sectional view of the substrate structure of the first embodiment according to the present invention after a reflow process.
Figure 2B:
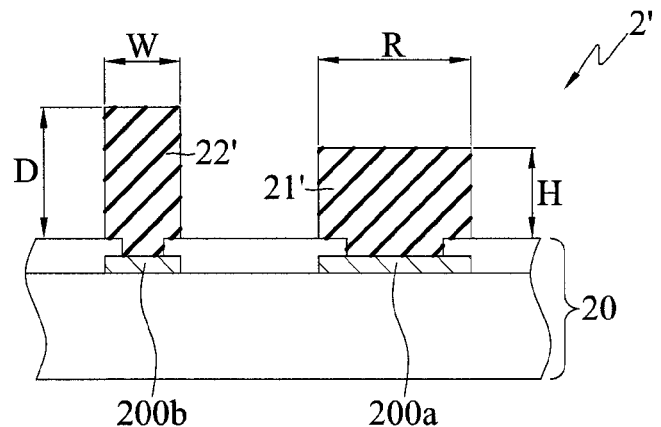
Figure 3:
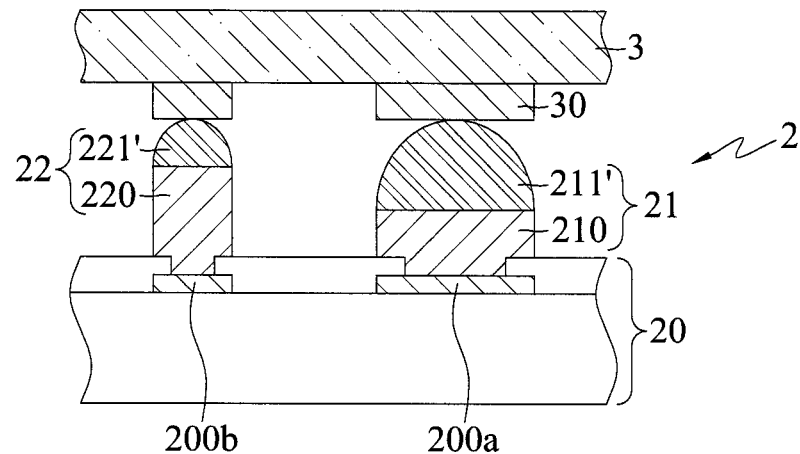
FIG. 3 is a schematic cross-sectional view of an embodiment of the substrate structure of FIG. 2B after a reflow process.

As shown in FIGS. 2B and 3, when conductive pads 30 of an electronic element 3 is reflowed on the first and second conductive bumps 21, 22 of the substrate structure 2, the first pre-solder layer 211' and the second pre-solder layer 221' are reflowed to form pre-solder bodies, and the height D' of the second conductive bump 22 with respect to the substrate body 20 is substantially equal to the height H' of the first conductive bump 21 with respect to the substrate body 20. For example, the first conductive bump 21 and the second conductive bump 22 have a height difference of 7.2 μm, which meets the coplanarity requirement.

In an embodiment, the electronic element 3 is an active element such as a semiconductor chip, a passive element such as a resistor, a capacitor or an inductor, or a combination thereof, a package, a silicon interposer, or a packaging substrate.

In the substrate structure 2 according to the present invention, the thickness h of the first metal layer 210 of a large diameter bump (i.e., the first conductive bump 21) is less than the thickness d of the second metal layer 220 of a small diameter bump (i.e., the second conductive bump 22). As such, after the reflow process, the height difference between the first and second metal layers can compensate for the height difference between the first and second pre-solder layers 211', 221', thereby causing the height H' of the first conductive bump 21 to be substantially equal to the height D' of the second conductive bump 22.

FIG. 2B' is a schematic cross-sectional view of a substrate structure 2' of a second embodiment according to the present invention. The second embodiment has different conductive bumps from the first embodiment.

As shown in FIG. 2B', each of the first and second conductive bumps 21', 22' has only one conductive material, such as a pre-solder layer or a metal layer, which includes copper, nickel, gold, tin, silver or a combination thereof.

The width W of each of the second conductive bumps 22' is less than the width R of each of the first conductive bumps 21'. The height D of each of the second conductive bumps 22' with respect to the substrate body 20 is greater than the height H of each of the first conductive bumps 21' with respect to the substrate body 20. For example, the height H of each of the first conductive bumps 21' with respect to the substrate body 20 is 10% to 90% of the height D of each of the second conductive bumps 22' with respect to the substrate body 20.

Figure 4:
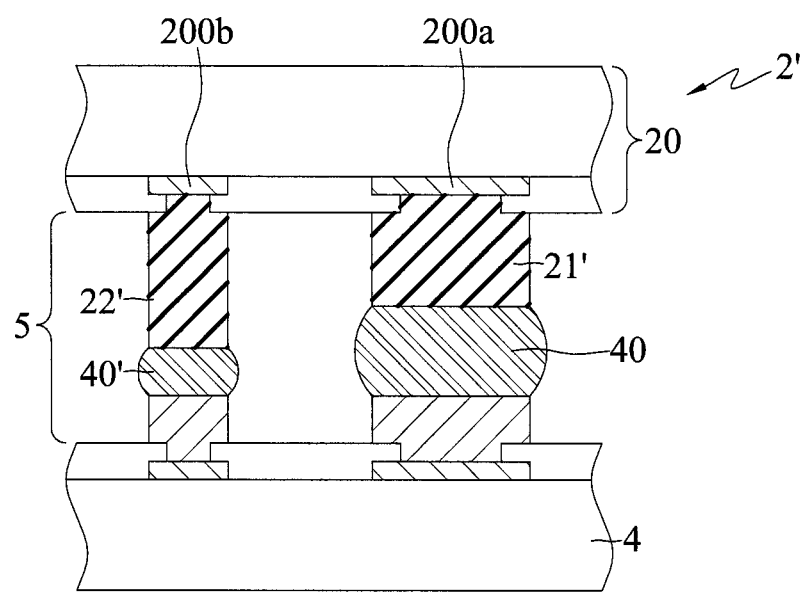
FIG. 4 is a schematic cross-sectional view of an embodiment of the substrate structure of the second embodiment according to the present invention after a reflow process.

As shown in FIG. 4, when the first and second conductive bumps 21', 22' of the substrate structure 2' are reflowed on the solder bumps 40, 40' of an electronic element 4, the reflowed solder bumps 40, 40' have different heights. As compensated by the height difference between the first conductive bumps 21' and the second conductive bumps 22', the connecting parts 5 (that are constituted by the first and second conductive bumps 21', 22' and the solder bumps 40, 40') have approximately the same height, and the coplanarity requirement is met.

In an embodiment, the electronic element 4 is an active element such as a semiconductor chip, a passive element such as a resistor, a capacitor or an inductor, or a combination thereof, a package, a silicon interposer, or a packaging substrate.

Therefore, in the substrate structure 2' according to the present invention the height H of the first conductive bump 21' (having a greater diameter) with respect to the substrate body 20 is less than the height D of the second conductive bump 22 (having a less diameter) with respect to the substrate structure 20. As such, after the reflow process, the height difference between the solder balls that have different diameters can be compensated, so as to obtain the connecting parts 5 that have a uniform height.

In sum, in a substrate structure according to the present invention, the height difference can be compensated since the height of each of the first conductive bumps with respect to the substrate body is less than the height of each of the second conductive bumps with respect to the substrate body, such that the coplanarity requirement is met.

The above-described descriptions of the detailed embodiments are only to illustrate the preferred implementation according to the present invention, and it is not intended to limit the scope of the present invention. Accordingly, all modifications and variations completed by those with ordinary skill in the art without departing from the spirit of the present invention should fall within the scope of the present invention defined by the appended claims.

What is claimed is:

1. A substrate structure, comprising:
    a substrate body having a plurality of conductive pads;
    a plurality of first conductive bumps disposed on a portion of the plurality of the conductive pads, each of the first conductive bumps containing at least a first conductive material; and
    a plurality of second conductive bumps disposed on a remaining portion of the plurality of the conductive pads, each of the second conductive bumps containing at least a second conductive material,
    wherein each of the second conductive bumps is less in width than each of the first conductive bumps, and each of the second conductive bumps is of a height with respect to the substrate body greater than a height of each of the first conductive bumps with respect to the substrate body, and
    the second conductive material and the first conductive material are reflowed such that the height of each of the second conductive bumps with respect to the substrate body is substantially equal to the height of each of the first conductive bumps with respect to the substrate body.

2. The substrate structure of claim 1, being a wafer, a chip, an interposer or a packaging substrate.

3. The substrate structure of claim 1, wherein the first conductive material is a first pre-solder layer formed by copper, nickel, gold, tin, silver or a combination thereof, and the second conductive material is a second pre-solder layer formed by copper, nickel, gold, tin, silver or a combination thereof.

4. The substrate structure of claim 3, wherein each of the first conductive bumps further includes a first metal layer with the first pre-solder layer formed thereon, and each of the second conductive bumps further includes a second metal layer with the second pre-solder layer formed thereon.

5. The substrate structure of claim 4, wherein the second metal layer is greater in thickness than the first metal layer.

6. The substrate structure of claim 4, wherein the first metal layer is greater in melting point than the first pre-solder layer.

7. The substrate structure of claim 4, wherein the second metal layer is greater in melting point than the second pre-solder layer.

8. The substrate structure of claim 4, wherein a thickness of the first metal layer is 10% to 90% of a thickness of the first conductive bump.

9. The substrate structure of claim 4, wherein a thickness of the second metal layer is 10% to 90% of a thickness of the second conductive bump.

10. The substrate structure of claim 1, wherein the height of the first conductive bump with respect to the substrate body is 10% to 90% of the height of the second conductive bump with respect to the substrate body.

* * * * *